United States Patent
Chan (10) Patent No.: US 10,454,462 B1
(45) Date of Patent: Oct. 22, 2019

(54) 50% DUTY CYCLE QUADRATURE-IN AND QUADRATURE-OUT (QIQO) DIVIDE-BY-3 CIRCUIT

(71) Applicant: Hong Kong Applied Science and Technology Research Institute Company, Limited, Hong Kong (HK)

(72) Inventor: Tat Fu Chan, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 0 days.

(21) Appl. No.: 16/387,651

(22) Filed: Apr. 18, 2019

(51) Int. Cl.
- *H03K 5/00* (2006.01)
- *G06F 1/06* (2006.01)
- *H03K 19/094* (2006.01)
- *H03K 17/687* (2006.01)

(52) U.S. Cl.
CPC ........... *H03K 5/00006* (2013.01); *G06F 1/06* (2013.01); *H03K 17/687* (2013.01); *H03K 19/094* (2013.01)

(58) Field of Classification Search
CPC ............. H03K 5/00006; H03K 17/687; H03K 19/094; G06F 1/06
USPC .......................................... 327/115, 117, 118
See application file for complete search history.

(56) References Cited

U.S. PATENT DOCUMENTS

| | | | |
|---|---|---|---|
| 7,579,883 B2 | 8/2009 | Dekate et al. | |
| 7,825,703 B2 * | 11/2010 | Qiao | H03K 23/42 327/115 |
| 9,059,714 B2 | 6/2015 | Sajjadi et al. | |
| 9,906,226 B2 | 2/2018 | Jia | |
| 9,935,640 B1 | 4/2018 | Chan et al. | |
| 9,954,543 B1 | 4/2018 | Chan et al. | |
| 2008/0260089 A1 | 10/2008 | Roine | |
| 2011/0200161 A1 | 8/2011 | Tasic et al. | |
| 2018/0262195 A1 | 9/2018 | Millar | |

OTHER PUBLICATIONS

Coleman et al., "Process compensated low power LO divider chain with asynchronous odd integer 50% duty cycle CML dividers", IEEE Radio Frequency Integrated Circuits Symposium, Jun. 2011.

\* cited by examiner

*Primary Examiner* — Tomi Skibinski (74) *Attorney, Agent, or Firm* — Stuart T. Auvinen; g Patent LLC (57) ABSTRACT

A Quadrature-In, Quadrature-Out (QIQO) clock divider divides by an odd divisor, such as three. An IQ input clock has in-phase and quadrature differential signals. Four stages of dynamic logic are arranged into a loop, with each stage output being one of four IQ output signals that have 90-degree phase separations. Each stage output drives the gates of a p-channel charging transistor and an n-channel discharging transistor of a next stage. Two p-channel charging logic transistors are in series between the next stage output and the p-channel charging transistor, and two n-channel evaluation transistors are in series between the next stage output and the n-channel discharging transistor. Different pairs of the four IQ input clock signals are applied to their gates. When the prior stage output is low, the stage output is charged. When the prior stage output is high, the stage output discharge timing is determined by the IQ signals.

20 Claims, 11 Drawing Sheets

FIG. 1

PRIOR ART

50% DUTY CYCLE QUADRATURE-IN AND QUADRATURE-OUT (QIQO) DIVIDE-BY-3 CIRCUIT

FIELD OF THE INVENTION

This invention relates to quadrature clock dividers, and more particularly to a divide-by-3 circuit for a quadrature clock.

BACKGROUND OF THE INVENTION

Highly-Integrated Integrated Circuit (IC) devices such as a System-On-a-Chip (SoC) are widely used. Wireless systems using a SoC may have fairly complex clocking requirements. For example, a clock synthesizer may be required to generate clocks from 285 MHz up to 2.4 GHz due to the various communication protocols and bands used. However, a single voltage-controlled oscillator (VCO) has a much more limited output frequency range.

Figure 1:
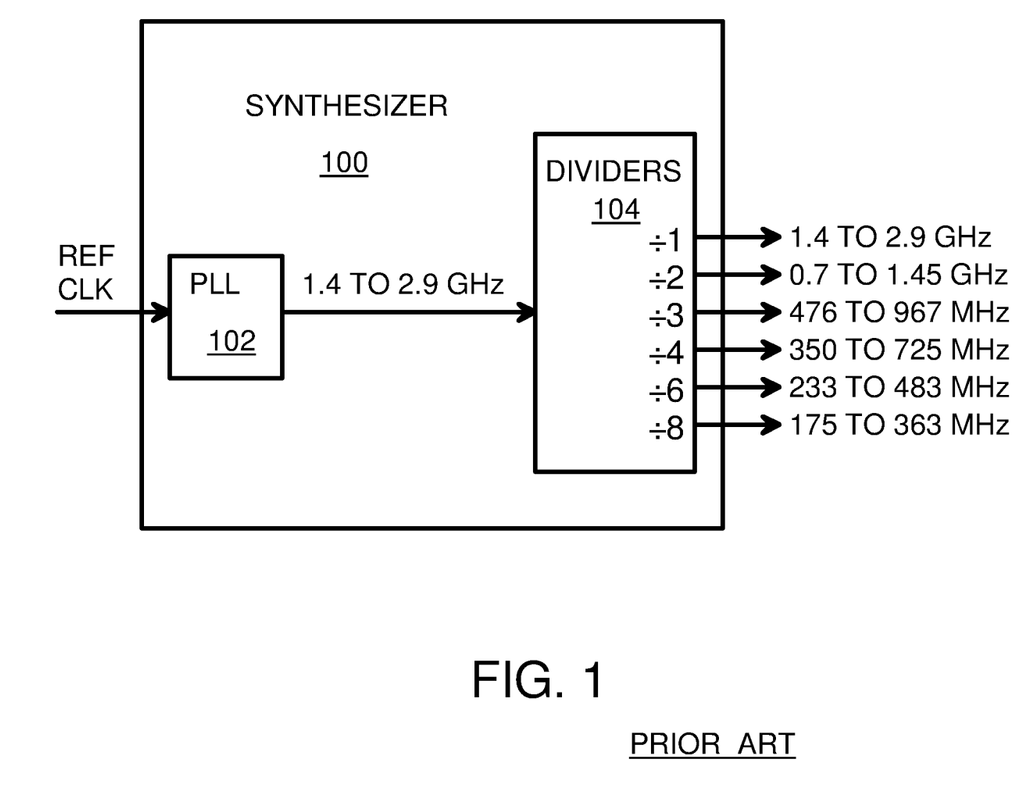
FIG. 1 shows a clock synthesizer using a divider to generate a wide range of output frequencies.

FIG. 1 shows a clock synthesizer using a divider to generate a wide range of output frequencies. A reference clock is applied to Phase-Locked Loop (PLL) 102, which generates an internal clock having a frequency range of 1.4 to 2.9 GHz. Dividers 104 then divide this clock by various selectable divisors, such as 1, 2, 3, 4, 6, 8. One or more of the outputs of dividers 104 can be output from synthesizer 100 for use by the system.

The range of output frequencies generated by dividers 104 is from 175 MHz up to 2.9 GHz. For example, when a 500 MHz clock is desired, dividers 104 can be set to a divisor of 3, which has a range of 476 MHz to 967 MHz, or to a divisor of 4, which has a range of 350 MHz to 725 MHz. PLL 102 can be adjusted to generate a PLL output of 1.5 GHz, when a divisor of 3 is selected for dividers 104, or a PLL output of 2.0 GHz when a divisor of 4 is selected for dividers 104. The PLL clock output from PLL 102 can be adjusted by adjusting the feedback divider in PLL 102.

Some simple communications systems require only an in-phase clock, where the clock and its inverse are used. The inverse clock is 180 degrees out of phase from the clock.

More complex communications systems may require a quadrature clock. A quadrature clock has the clock and inverse clock that are 180 degrees out of phase, and also has a pair of clocks that are 90 degrees out of phase with the clock and inverse clock.

Figure 2:
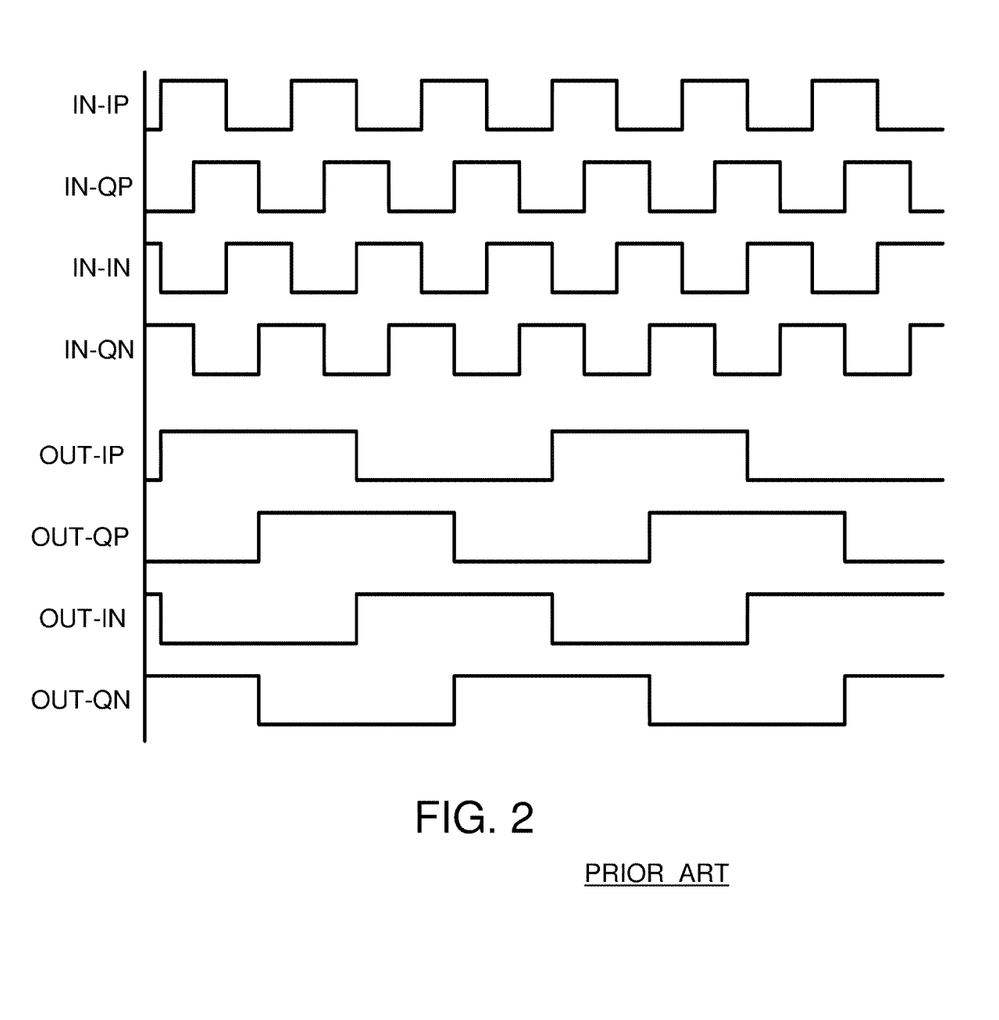
FIG. 2 highlights a quadrature input clock and a divided-down quadrature output clock.

FIG. 2 highlights a quadrature input clock and a divided-down quadrature output clock. An input clock IN has four phased clocks that are separated from each other by 90-degree increments. The four clocks include a true in-phase clock IN-IP, a complement in-phase clock IN-IN that has a 180 degree phase delay from IN-IP, a true quadrature phase clock IN-QP that has a 90 degree phase delay from IN-IP, and a complement quadrature phase clock IN-QN, that has a 270-degree phase delay from IN-IP. These are quadrature or IQ signals.

When a divisor of 3 is selected for dividers 104, then the output clock has a period that is three times the period of the input clock. The same 90-degree phase spacings are desired for the divided-by-3 output clocks. OUT-IP, OUT-QP, OUT-IN, and OUT-QN are generated at 90-degree phase increments, with phase delays of 0, 90, 180, and 270, respectively. Ideally, the duty cycle is 50% for all input and output clock waveforms.

Clock dividers with even divisors are typically easier to implement than are odd-divisor clock dividers. For example, divisors of 2, 4, 6, and 8 are typically easier to implement in dividers 104 that the odd divisor of 3.

Various prior-art approaches have been used to generate clocks. Analog approaches often have high power consumption and require a large area. Analog approaches may not be feasible for low-voltage power supplies. Digital dividers may require calibration. Some approaches do not provide a 50% duty cycle.

Some prior-art approaches simply use delay lines to generate the phased clocks. However, clock accuracy may be poor, especially when quadrature clocks are needed. The clock range may be limited. When inductors are used, a large chip area and cost may result. Analog devices typically do not scale down to smaller process geometries as do digital circuits.

What is desired is a clock divider with an odd divisor. A divide-by-3 circuit is desired that generates clocks with 50% duty cycles. A digital circuit that divides a quadrature clock by an odd divisor to generate a quadrature output clock with good phase accuracy is desirable.

DETAILED DESCRIPTION

The present invention relates to an improvement in odd-divisor quadrature clock generators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
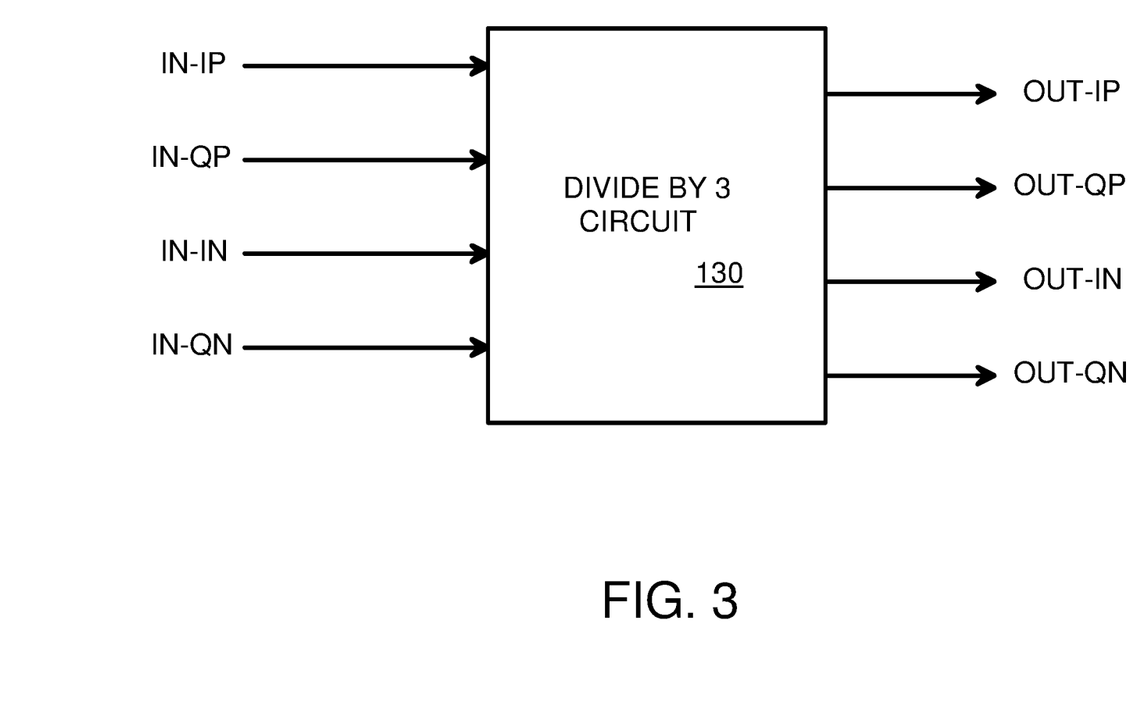
FIG. 3 shows a Quadrature-In, Quadrature-Out (QIQO) divide-by-3 circuit.

FIG. 3 shows a Quadrature-In, Quadrature-Out (QIQO) divide-by-3 circuit. An input clock has four phases that are separated by 90-degree increments. An in-phase signal IN-IP and its complement IN-IN can be a first differential input. A quadrature-phase signal IN-QP and its complement IN-QN can be a second differential input that is 90-degrees out of phase with the first differential input.

Divide-by-3 circuit 130 divides the four input signal IN-IP, IN-QP, IN-IN, IN-QN by three to generate the output IQ signals OUT-IP, OUT-QP, OUT-IN, OUT-QN. OUT-IP and OUT-IN can be a first differential signal output, while OUT-QP and OUT-QN can be a second differential signal output that is delayed by 90 degrees. All 8 signals have a 50% duty cycle, but the output IQ clock frequency is one-third of the input IQ clock frequency.

Figure 4:
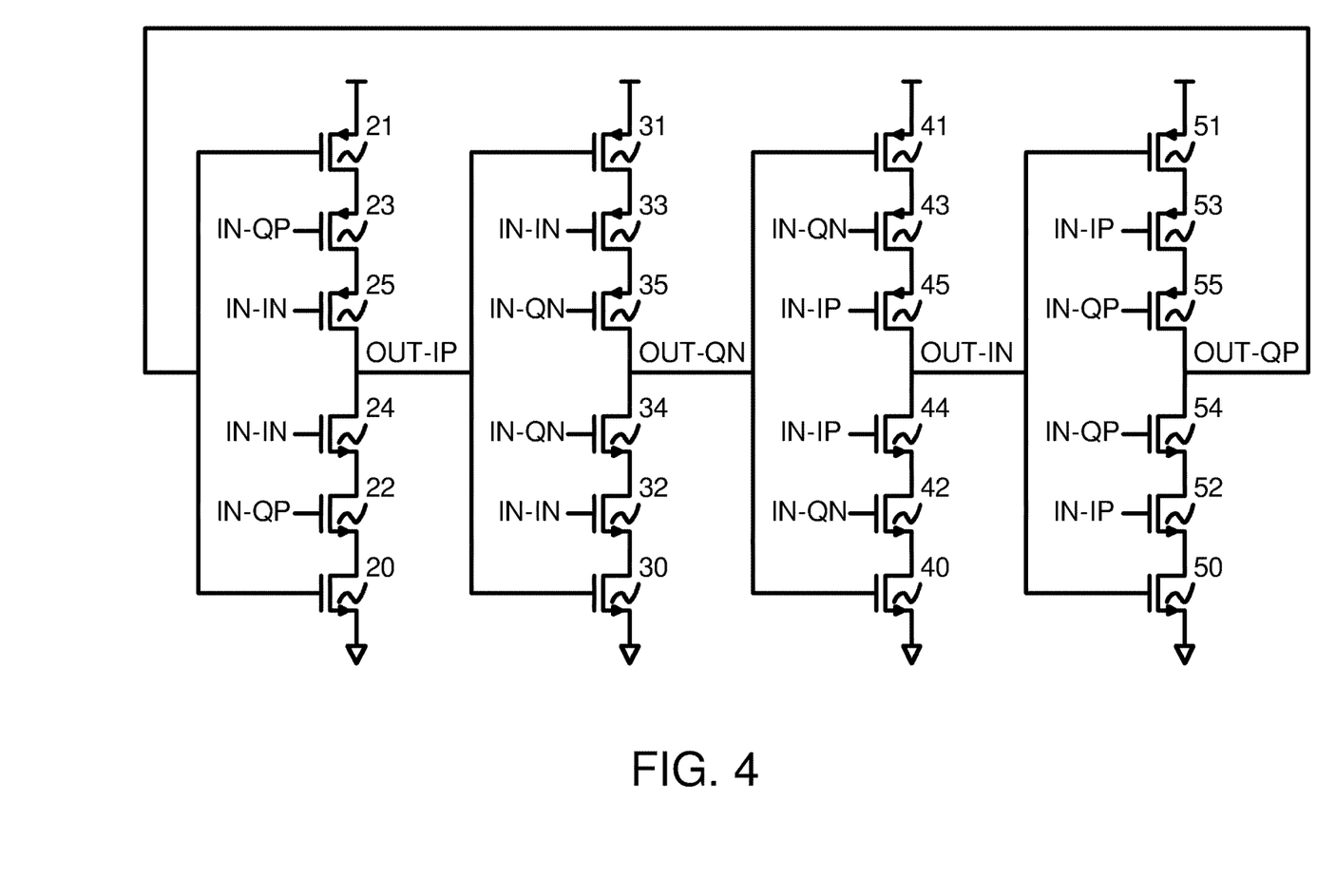
FIG. 4 is a schematic diagram of a quadrature divide-by-3 circuit.

FIG. 4 is a schematic diagram of a quadrature divide-by-3 circuit. Four stages of dynamic logic connected in a ring or loop drive four outputs OUT-IP, OUT-QN, OUT-IN, OUT-QP, which are in 90-degree phase decrements. Each prior stage's output enables charging the next stage by being applied to the gates of p-channel charging transistors 21, 31, 41, 51, which have sources connected to power. Each stage's output is also applied to the gates of n-channel discharging transistors 20, 30, 40, 50, which have grounded sources. N-channel discharging transistors 20, 30, 40, 50 enable discharging of the next stage.

Each stage also has two p-channel charging-logic transistors that are in series between the p-channel charging transistor and the stage output, and two n-channel evaluation transistors that are in series between the stage output and the n-channel discharging transistor. The p-channel charging-logic transistors have gates receiving two of the input IQ signals. When both of these two input IQ signals are low, and the prior stage output is also low, then the stage output is charged high. Thus the two input IQ signals applied to the gates of the p-channel charging-logic transistors help define the rising-edge timing of the stage output.

The two input IQ signals are also applied to the gates of the n-channel evaluation transistors. When both of these two input IQ signals are high, and the prior stage output is also high, then the stage output is discharged low. Thus the two input IQ signals applied to the gates of the n-channel evaluation transistors also help define the falling-edge timing of the stage output.

For example, the first stage receives the final stage output, OUT-QP, on the gate of p-channel charging transistor 21. The gates of p-channel charging-logic transistors 23, 25 receive input signals IN-QP and IN-IN. When the prior output OUT-QP is low, and both IQ inputs IN-QP and IN-IN are low, then the stage output OUT-IP is charged high. This rising edge is shown as the first rising edge in the OUT-IP waveform of FIG. 5, which occurs as soon as IN-IN goes low, when IN-QP and OUT-QP are already low.

The first stage also receives the final stage output, OUT-QP, on the gate of n-channel discharging transistor 20. The gates of n-channel evaluation transistors 22, 24 receive input signals IN-QP and IN-IN. When the prior output OUT-QP is high, and both IQ inputs IN-QP and IN-IN are high, then the stage output OUT-IP is discharged low. This falling edge of the OUT-IP waveform of FIG. 5 occurs as soon as IN-IN goes high, when IN-QP and OUT-QP are already high.

The second stage has charging enabled through p-channel charging transistor 31 when prior stage output OUT-IP is low, and discharging or evaluation enabled through n-channel discharging transistor 30 when OUT-IP is high. A different pair of IQ signals, IN-IN and IN-QN, is applied to the gates of p-channel charging-logic transistors 33, 35 and n-channel evaluation transistors 32, 34.

Figure 5:
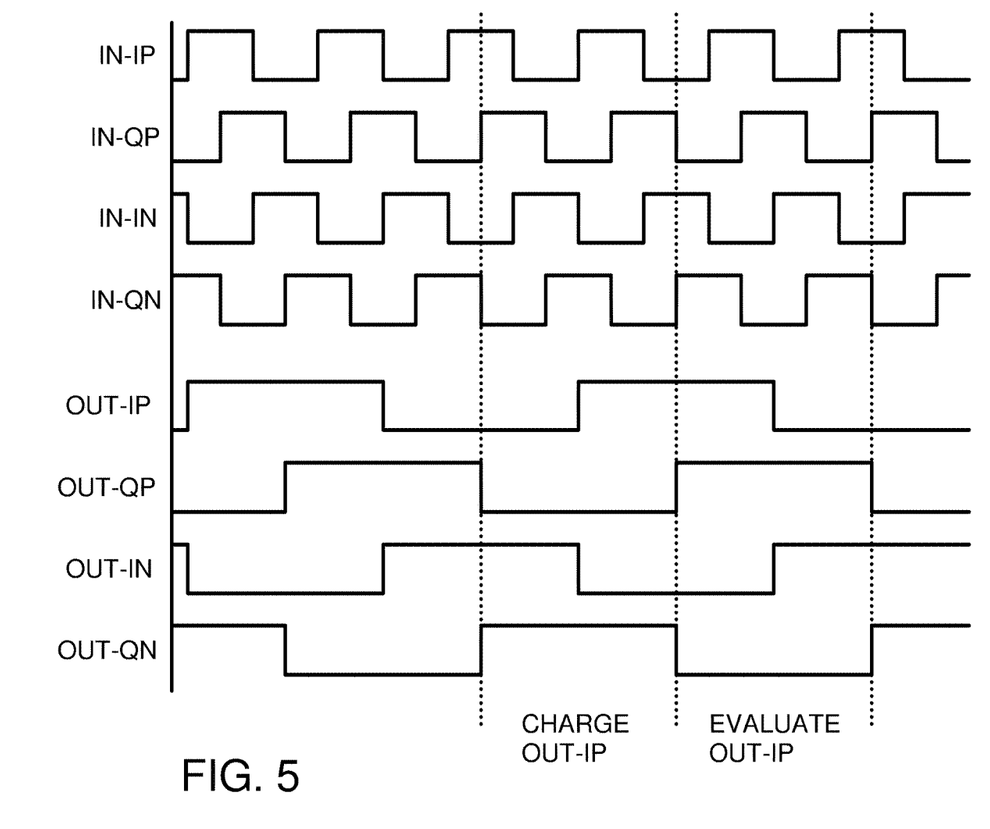
FIG. 5 is a waveform diagram of the Quadrature-In, Quadrature-Out (QIQO) divide-by-3 circuit.

Second stage output OUT-QN goes high when OUT-IP, IN-IN, and IN-QN are all low, as shown at the first dotted vertical line in FIG. 5. Second stage output OUT-QN goes low when OUT-IP, IN-IN, and IN-QN are all high, as shown at the middle dotted vertical line in FIG. 5.

The third stage has charging enabled through p-channel charging transistor 41 when prior stage output OUT-QN is low, and discharging or evaluation enabled through n-channel discharging transistor 40 when OUT-QN is high. A different pair of IQ signals, IN-QN and IN-IP, is applied to the gates of p-channel charging-logic transistors 43, 45 and n-channel evaluation transistors 42, 44.

Third stage output OUT-IN goes high when OUT-QN, IN-QN, and IN-IP are all low. Third stage output OUT-IN goes low when OUT-QN, IN-QN, and IN-IP are all high, as shown by the first edge transition in FIG. 5. OUT-IN is the inverse of OUT-IP.

The fourth stage has charging enabled through p-channel charging transistor 51 when prior stage output OUT-IN is low, and discharging or evaluation enabled through n-channel discharging transistor 50 when OUT-IN is high. A different pair of IQ signals, IN-IP and IN-QP, is applied to the gates of p-channel charging-logic transistors 53, 55 and n-channel evaluation transistors 52, 54.

Fourth stage output OUT-QP goes high when OUT-IN, IN-IP, and IN-QP are all low, as shown at the middle dotted line in FIG. 5. Fourth stage output OUT-QP goes low when OUT-IN, IN-IP, and IN-QP are all high, as shown by the first and last dotted lines in FIG. 5. OUT-QP is the inverse of OUT-QN.

Only one of p-channel charging transistor 21 and n-channel discharging transistor 20 can be turned on at any time, since both transistors receive the same signal on their gate. This prevents the occurrence of a power-to-ground current path. Power consumption is reduced. Other stages also are prevented from having a power-to-ground path by their complementary logic.

FIG. 5 is a waveform diagram of the Quadrature-In, Quadrature-Out (QIQO) divide-by-3 circuit. Four input IQ signals, IN-IP, IN-QP, IN-IN, IN-QN, are at 90-degree phase increments. These four input IQ signals are applied to the divide-by-3 circuit of FIG. 4 to generate four output IQ signals, OUT-IP, OUT-QP, OUT-IN, OUT-QN, which also have 90-degree phase increments. Good phase accuracy of the divide-by-3 circuit provides for 50% duty cycles on the output IQ signals.

Each stage in the divide-by-3 circuit can operate in two modes. During the charging phase, the prior stage output is low, turning on the p-channel charging transistor and turning off the n-channel discharging transistor for that stage. The stage output can be driven high but cannot be driven low during the charging phase. The low-to-high transition of the stage output occurs during the charging phase, such as shown in the waveform diagram for the first stage that generates OUT-IP.

During the evaluation phase, the prior stage output is high, turning off the p-channel charging transistor and turning on the n-channel discharging transistor for that stage. The stage output can be driven low but cannot be driven high during the evaluation phase. The high-to-low transition of the stage output occurs during the evaluation phase, such as shown in the waveform diagram for the first stage that generates OUT-IP.

The charging and evaluation phases are staggered for each of the four stage outputs. Every 90 degrees of the output clock, or every 1.5 periods of the input clock, one stage output changes from the charging to the evaluation phase, while another stage output changes from the evaluation phase to the charging phase. After another 1.5 periods of the input clock, the other two stage outputs change, one from the charging to the evaluation phase, while another stage output changes from the evaluation phase to the charging phase.

Figure 6:
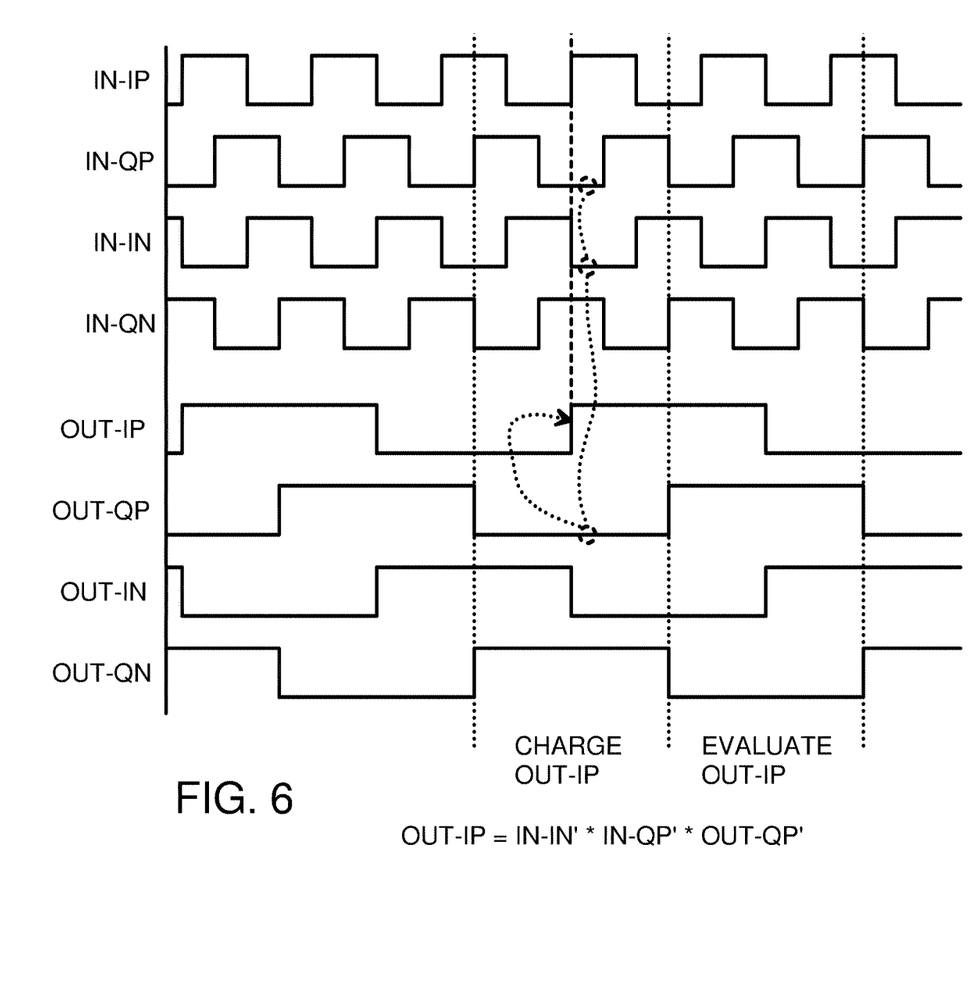
FIG. 6 is a waveform diagram highlighting the rising-edge generation during the charging phase.

FIG. 6 is a waveform diagram highlighting the rising-edge generation during the charging phase. The charging phase of the first stage begins when the prior stage output, OUT-QP, goes low. This is shown by the first dotted vertical line. After half of an input clock period, input IN-QP goes low, but IN-IN is still high. Then after another quarter of an input clock period, IN-IN goes low. Then all three inputs to the first stage are low, OUT-QP, IN-QP, and IN-IN, as shown by the dashed vertical line. All three of p-channel charging transistor 21 and p-channel charging-logic transistors 23, 25 are turned on, driving the stage output OUT-IP high.

The actual low-to-high transition of OUT-IP occurs in the middle of the charging phase, when the other two inputs, IN-QP and IN-IN, are also low. Since IN-IN is the last to go low, the precise timing of the rising edge of stage output OUT-IP is determined by the falling edge of IQ input signal IN-IN. A highly accurate IQ output clock can be generated by this staggered timing since there are no race conditions or glitching.

Parasitic capacitances on the node of stage output OUT-IP are charged when OUT-IP is driven high. These parasitic capacitances keep OUT-IP in the high state until the stage output is discharged during the evaluation phase. Thus the stage output remains high until discharged during the evaluation phase.

Figure 7:
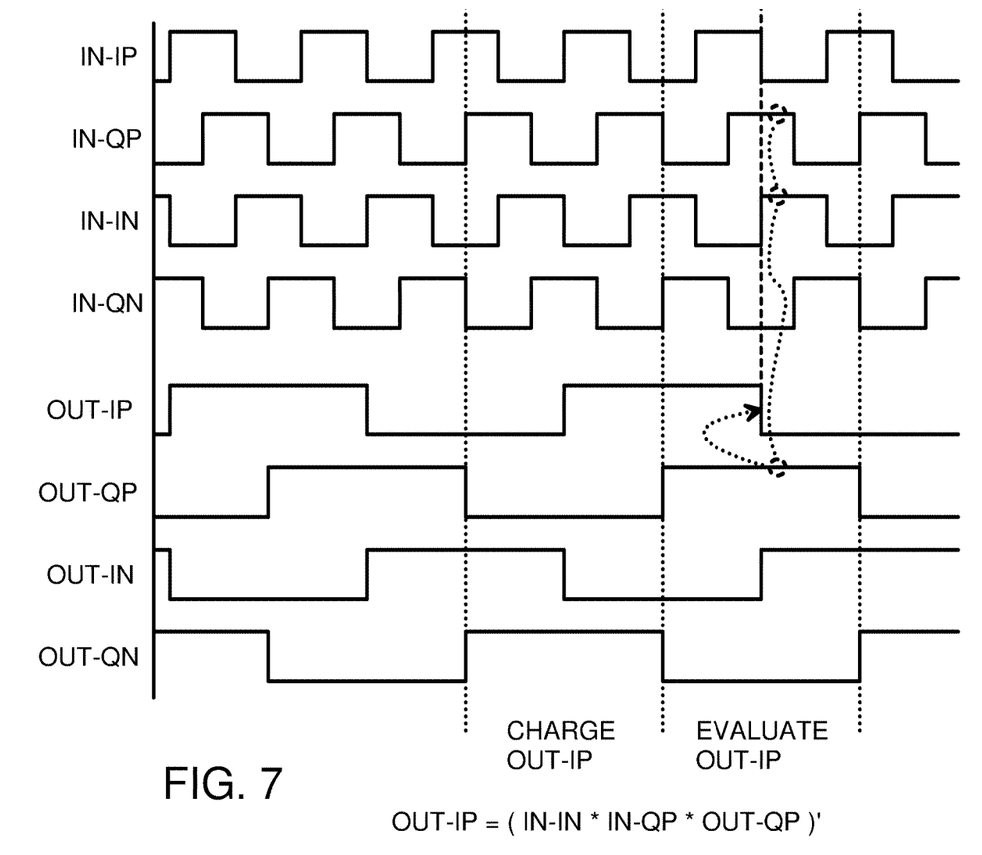
FIG. 7 is a waveform diagram highlighting the falling-edge generation during the evaluation phase.

FIG. 7 is a waveform diagram highlighting the falling-edge generation during the evaluation phase. The evaluation phase of the first stage begins when the prior stage output, OUT-QP, goes high. This is shown by the middle dotted vertical line. After half of an input clock period, input IN-QP goes high, but IN-IN is still low. Then after another quarter of an input clock period, IN-IN goes high. Then all three inputs to the first stage are high, OUT-QP, IN-QP, and IN-IN, as shown by the dashed vertical line. All three of n-channel discharging transistor 20 and n-channel evaluation transistors 22, 24 are turned on, driving the stage output OUT-IP low.

Figure 8:
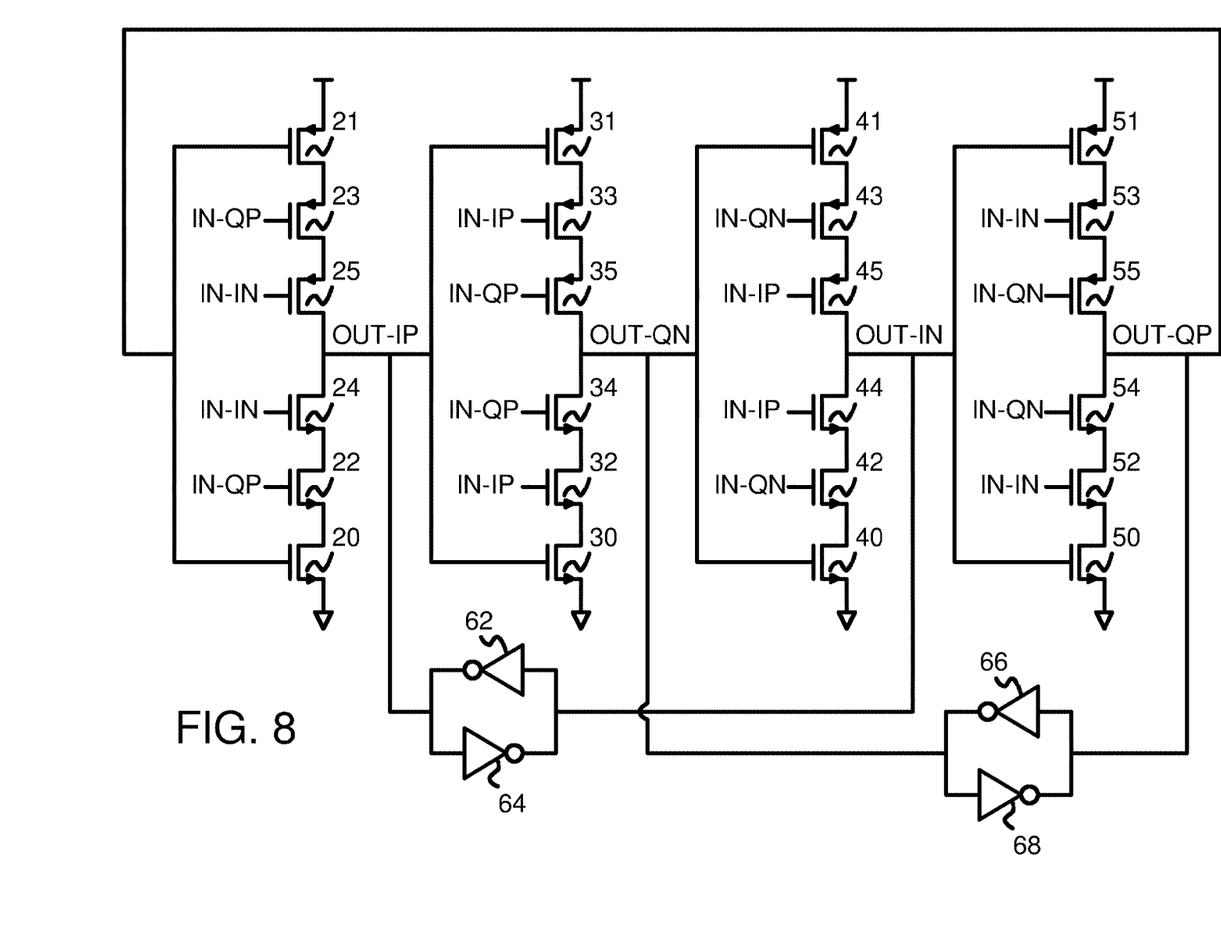
FIG. 8 is a schematic of the QIQO divide-by-3 circuit with regenerative latches.

FIG. 8 is a schematic of the QIQO divide-by-3 circuit with regenerative latches. In this alternative, bi-stable elements such as latches are added across the differential outputs. The first and third stage outputs, OUT-IP and OUT-IN, are inverses of each other and can be a differential signal. The output of inverter 62 is connected to the input of inverter 64 and to the first stage output OUT-IP, while the input of inverter 62 is connected to the output of inverter 64 and to third stage output OUT-IN. Inverters 62, 64 form a bi-stable latch between OUT-IP and OUT-IN. Inverters 62, 64 act to regenerativly drive OUT-IP and OUT-IN high and low. The resulting edges of OUT-IP and OUT-IN can be sharpened using inverters 62, 64.

Inverters 66, 68 form a second bi-stable latch that regeneratively drive the second and fourth stage outputs OUT-QN and OUT-QP. Outputs OUT-QP and OUT-QN are inverses of each other and form a second differential output. Inverters 66, 68 can sharpen the edges of OUT-QP and OUT-QN, providing better clock signals.

Figure 9:
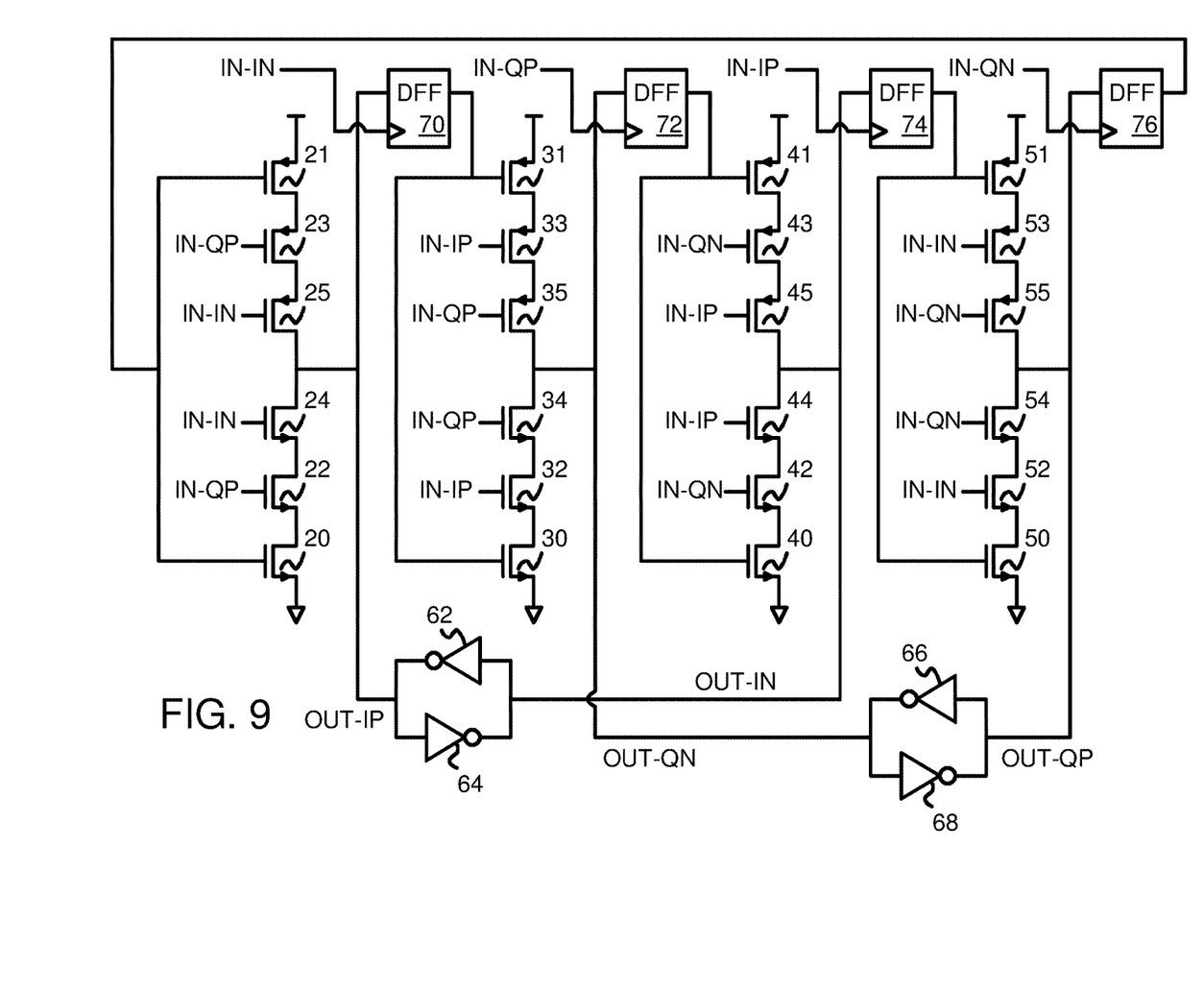
FIG. 9 is a QIQO divide-by-5 circuit.

FIG. 9 is a QIQO divide-by-5 circuit. Four stages are still used since the QIQO divide-by-5 circuit still generates four outputs as described earlier for the divide-by-3 circuit of FIGS. 4, 8. However, delays are added between stages to extend the divisor from 3 to 5. D-type flip-flops 70, 72, 74, 76 delay the prior-stage output by one input clock period. The following stage is delayed from entering the charging phase by half of an input clock period and is also delayed from entering the evaluation phase by another half of one input clock period, for a total delay of one input clock period. The combinatorial logic is also adjusted to obtain 50% duty cycles and unique equations.

D-type flip-flop 70 is clocked by IN-IN and has OUT-IP as its D input. OUT-IP has rising and falling edges that are triggered by IN-IN, since the other two inputs, IN-QP and the delayed output OUT-QP-D, change before IN-IN does. Thus D-type flip-flop 70 is clocked by the last input to change in the prior stage.

D-type flip-flop 72 is clocked by IN-QP, which is also the last of the three inputs to change for the second stage. D-type flip-flop 74 is clocked by IN-IP, which is also the last of the three inputs to change for the third stage. D-type flip-flop 76 is clocked by IN-QN, which is also the last of the three inputs to change for the fourth stage.

Figure 10:
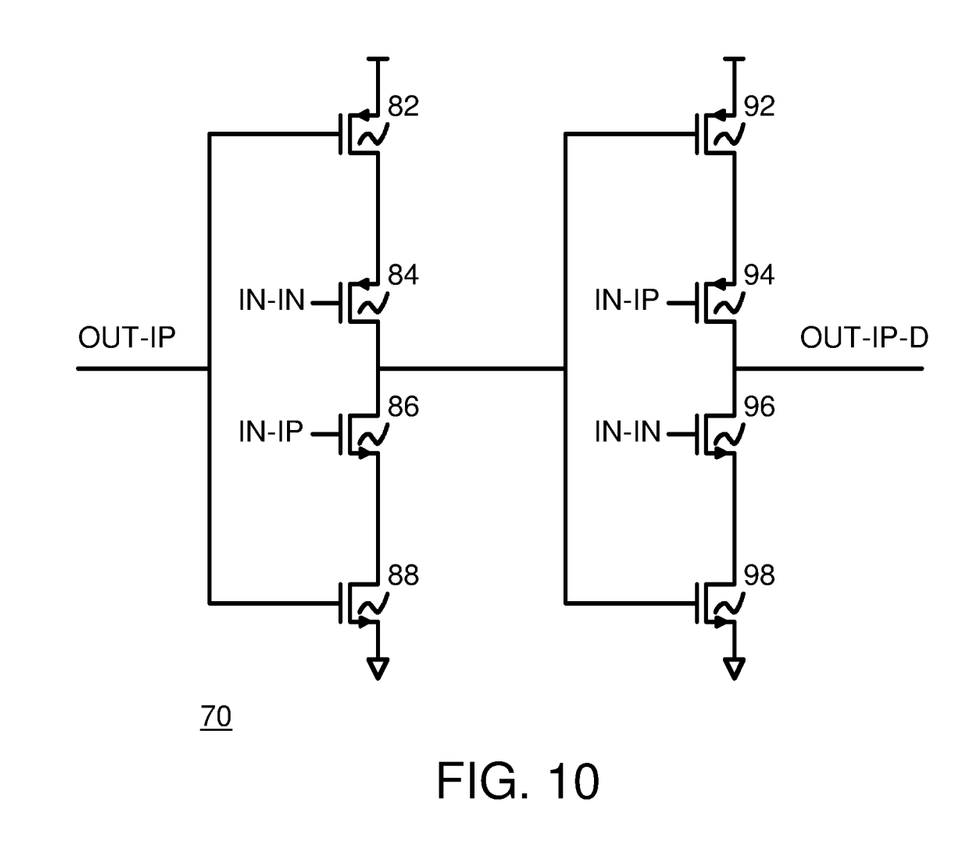
FIG. 10 shows the D-type flip-flop in more detail.

FIG. 10 shows the D-type flip-flop in more detail. Dynamic logic is used to implement D-type flip-flop 70. The prior-stage output, such as OUT-IP, is applied to the gates of p-channel charging transistor 82 and n-channel discharging transistor 88. The clock input to D-type flip-flop 70 and its complement are applied to clocking transistors 84, 86, 94, 96. For example, when IN-IN is the clock, then IN-IP is its complement and is applied to the gates of n-channel clocking transistor 86 and p-channel clocking transistor 94. Clock IN-IN is applied to the gates of p-channel clocking transistor 84 and n-channel clocking transistor 96. The output of the first stage, the drains of p-channel clocking transistor 84 and n-channel clocking transistor 86, are connected to the gates of p-channel second-stage latch transistor 92 and n-channel second-stage latch transistor 98. The drains of p-channel clocking transistor 94 and n-channel clocking transistor 96 drive the output of D-type flip-flop 70, which is the delayed stage output, OUT-IP-D.

In operation, when IN-IN goes low and IN-IP goes high, both of clocking transistors 84, 86 are on, and both of clocking transistors 94, 96 are off. The value of D-input OUT-IP is inverted by p-channel charging transistor 82 and n-channel discharging transistor 88 to drive the gates of p-channel second-stage latch transistor 92 and n-channel second-stage latch transistor 98.

When IN-IN then goes high and IN-IP goes low, both of clocking transistors 84, 86 are off, and both of clocking transistors 94, 96 are now on. The inverted value of D-input OUT-IP that was driven to the gates of p-channel second-stage latch transistor 92 and n-channel second-stage latch transistor 98 is then inverted and propagates through clocking transistors 94, 96 to drive the delayed stage output OUT-IP-D. Thus the clock's rising edge latches the D-input to the flip-flop output.

Figure 11:
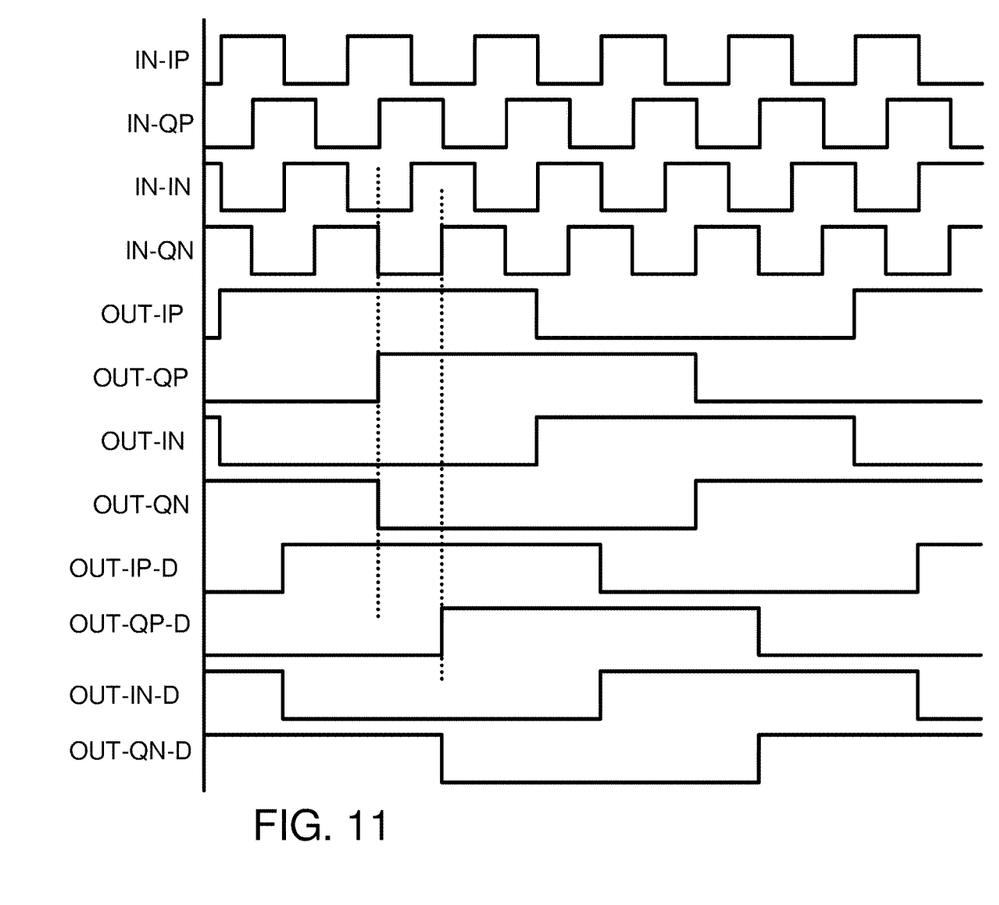
FIG. 11 is a waveform diagram of the QIQO divide-by-5 circuit of FIG. 9.

FIG. 11 is a waveform diagram of the QIQO divide-by-5 circuit of FIG. 9. The prior stage output is delayed by one clock before being inputted to the next stage as a delayed stage output. For example, the final stage output OUT-QP goes high at the first dotted vertical line. D-type flip-flop 76 is clocked by IN-QN and delays OUT-QP until the next rising edge of IN-QN, when OUT-QP-D goes high, at the second dotted vertical line. The first stage cannot enter its evaluation phase until OUT-QP-D goes high. Then when both IN-IN and IN-QP go high, the first stage output OUT-IP goes low, 270 degrees in phase after OUT-QP-D goes high.

The four stage outputs can be described by the logic equations for the charging pull-up networks of transistors:

OUT-IP=IN-IN' AND IN-QP' AND OUT-QP-D'

OUT-QN=IN-QP' AND IN-IP' AND OUT-IP-D'

OUT-IN=IN-IP' AND IN-QN' AND OUT-QN-D'

OUT-QP=IN-QN' AND IN-IN' AND OUT-IN-D'

The four stage outputs can be described by the logic equations for the evaluation/discharging networks of transistors:

OUT-IP=(IN-IN AND IN-QP AND OUT-QP-D)'

OUT-QN=(IN-QP AND IN-IP AND OUT-IP-D)'

OUT-IN=(IN-IP AND IN-QN AND OUT-QN-D)'

OUT-QP=(IN-QN AND IN-IN AND OUT-IN-D)'

ALTERNATE EMBODIMENTS

Several other embodiments are contemplated by the inventors. The order or sequence of the p-channel transistors in the pull-up networks or n-channel transistors in the pull-down networks can be altered. For example, in FIG. 4, p-channel charging-logic transistors 23, 25 could have their gates reversed, so that IN-IN is applied to the gate of p-channel charging-logic transistor 23 and IN-QP is applied to the gate of p-channel charging-logic transistor 25.

The timing may be adjusted somewhat while still allowing the divider circuit to operate acceptably, even if not optimally. Different ones of the IQ inputs signals could be applied to different gates of the p-channel charging-logic transistors and n-channel evaluation transistors that was has been shown in the examples. Such substitutions can alter the exact point in time when nodes are charged or discharged, and intermediate nodes may be left floating for a short period of time.

For example, FIGS. 4 and 8 differ slightly in the applied signals. The divide-by-3 circuit of FIG. 4 has p-channel charging-logic transistors 33, 35 and n-channel evaluation transistors 32, 34 receiving IN-IN and IN-QN, while in FIG. 8 these same transistors 33, 35, 32, 34 receive IN-IP and IN-QP. In FIG. 8, the added latches of inverters 62, 64, 66, 68 connect two different stage outputs, so the inputs to the stages driving those outputs are complements of each other, which is thought to produce better timing matches. For example, inverters 62, 64 connect the first and third stage outputs. The first stage has inputs IN-IN and IN-QP, while the third stage has inputs IN-IP and IN-QN, which are the exact compliments of the first-stage inputs.

More complex logic trees could be added to one or more stages, such as to add disabling transistors to disable clock generation, such as for power-down modes. Filters could be added to various nodes, such as by adding capacitors, resistors, or networks of resistors and capacitors. Leaker resistors could be added. Parasitic capacitances and resistances may be present. While p-channel transistors and n-channel transistors have been shown, other kinds of transistors could be substituted.

While dynamic logic has been shown for D-type flip-flop 70, 72, 74, 76, other kinds of flip-flops or latches could be substituted. Various schematics and circuits may be used for the flip-flops. Inverters 62, 64 have been shown as a simple bi-stable latch. Other kinds of bi-stable elements could be substituted, such as adding transmission gates to inverters 62, 64, so that the regeneration could be disabled by turning off the transmission gates and isolating inverters 62, 64 from the stage outputs. Hysteresis could be added for more complex waveform shaping.

While ideal 50% duty cycle clocks for both input and output IQ signals have been described, actual IQ signals may vary somewhat from ideal, such as being 50%+/−5%, 10%, etc. especially when loading, circuit and device variations, process, temperature, and voltage variations occur. Some systems may tolerate clocks with less than ideal duty cycles, or some systems may be designed to only use rising edges of clocks and not be sensitive to the duty cycle.

Inverters 62, 64, 66, 68 in FIG. 9 could be removed, especially for slower clocks or faster processes where the output clock rise and fall times are not as critical or are otherwise sufficient. While a divide-by-3 circuit and a divide-by-5 circuit have been shown in detail, other divisors could be substituted. The delays created by D-type flip-flops 70, 72, 74, 76 could be increased to provide for a divisor greater than 5. The delays created by D-type flip-flops 70, 72, 74, 76 could be programmable, so that a divisor of 3, 5, or 7 could be selected by setting the delay to 0, 1, or 2 clock cycles. Buffers could be added between stages, or more stages or dummy stages could be added.

Different transistor, capacitor, resistor, and other device sizes can be used, and various layout arrangements can be used, such as multi-leg, ring, doughnut or irregular-shape transistors. Additional taps, guard rings, transistors, and other components may be added. More than one power supply may be used. Buffers may be added to the stage outputs to drive the clock signals to the system or to strengthen the drive capability of the clock signals.

While descriptions of current flows and operations have been presented, these are theoretical and the theories may be incomplete or even incorrect. The input and output clocks have been described as having 90-degree phase separations, such as a clock with four signals that have phases of 0, 90, 180, and 270 degrees. It is understood that these are ideal phase values, and that actual phases may vary somewhat, such as +/−5%, 10%, etc., and still be considered to have 90-degree phase separation.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A Quadrature-In, Quadrature-Out (QIQO) clock divider comprising:
   an In-phase and Quadrature (IQ) input that receives an IQ input clock having an input frequency, the IQ input clock having four signals with 90-degree phase separation and all having the input frequency, the four signals including a true in-phase clock, a complement in-phase clock, a true quadrature clock, and a complement quadrature clock;
   an IQ output for an IQ output clock having an output frequency that is the input frequency divided by an odd divisor of at least 3;
   wherein the IQ output clock has four signals with 90-degree phase separation and all having the output frequency, the four signals including a true in-phase output clock, a complement in-phase output clock, a true quadrature output clock, and a complement quadrature output clock;
   a first stage that drives the true in-phase output clock, the first stage having a first pull-up series of transistors that charge the true in-phase output clock, and a first pull-down series of transistors that discharge the true in-phase output clock;
   a second stage that drives the complement quadrature output clock, the second stage having a second pull-up series of transistors that charge the complement quadrature output clock, and a second pull-down series of transistors that discharge the complement quadrature output clock;
   a third stage that drives the complement in-phase output clock, the third stage having a third pull-up series of transistors that charge the complement in-phase output clock, and a third pull-down series of transistors that discharge the complement in-phase output clock;
   a fourth stage that drives the true quadrature output clock, the fourth stage having a fourth pull-up series of transistors that charge the true quadrature output clock, and a fourth pull-down series of transistors that discharge the true quadrature output clock;
   wherein the first, second, third, and fourth pull-up series of transistors each comprise:
      a charging transistor that has a gate receiving an output clock generated by a prior stage;
      an in-phase charging-logic transistor having a gate receiving an in-phase clock from the IQ input; and
      a quadrature charging-logic transistor having a gate receiving a quadrature clock from the IQ input;
   wherein the first, second, third, and fourth pull-down series of transistors each comprise:
      a discharging transistor that has a gate receiving an output clock generated by a prior stage;
      an in-phase evaluation transistor having a gate receiving an in-phase clock from the IQ input; and
      a quadrature evaluation transistor having a gate receiving a quadrature clock from the IQ input;
   whereby the IQ input clock is divided by the odd divisor to generate the IQ output clock having in-phase and quadrature components.

2. The QIQO clock divider of claim 1 wherein the first, second, third, and fourth pull-up series of transistors each comprise three p-channel transistors having their channels in series;

wherein the first, second, third, and fourth pull-down series of transistors each comprise three n-channel transistors having their channels in series.

3. The QIQO clock divider of claim 2 wherein the charging transistor has a source connected to a power supply;
   wherein the discharging transistor has a source connected to a ground.

4. The QIQO clock divider of claim 3 wherein when the first, second, third, or fourth pull-up series of transistors is for a stage generating an in-phase output clock, the in-phase charging-logic transistor has a drain connected to the in-phase output clock, wherein the quadrature charging-logic transistor is connected between the charging transistor and the in-phase charging-logic transistor;
   wherein when the first, second, third, or fourth pull-down series of transistors is for the stage generating the in-phase output clock, the in-phase evaluation transistor has a drain connected to the in-phase output clock, wherein the quadrature evaluation transistor is connected between the discharging transistor and the in-phase evaluation transistor;
   wherein when the first, second, third, or fourth pull-up series of transistors is for a stage generating a quadrature output clock, the quadrature charging-logic transistor has a drain connected to the quadrature output clock, wherein the in-phase charging-logic transistor is connected between the charging transistor and the quadrature charging-logic transistor;
   wherein when the first, second, third, or fourth pull-down series of transistors is for the stage generating the quadrature output clock, the quadrature evaluation transistor has a drain connected to the quadrature output clock, wherein the in-phase evaluation transistor is connected between the discharging transistor and the quadrature evaluation transistor.

5. The QIQO clock divider of claim 4 wherein the true in-phase clock has an ideal phase of zero, the complement in-phase clock has an ideal phase of 180 degrees, the true quadrature clock has an ideal phase of 90 degrees, and the complement quadrature clock has an ideal phase of 270 degrees;
   wherein the true in-phase output clock has an ideal phase of zero, the complement in-phase output clock has an ideal phase of 180 degrees, the true quadrature output clock has an ideal phase of 90 degrees, and the complement quadrature output clock has an ideal phase of 270 degrees;
   wherein actual phases are within 10% of ideal phases.

6. The QIQO clock divider of claim 5 wherein the first stage receives the true quadrature output clock from the fourth stage on the gate of the charging transistor and on the gate of the discharging transistor in the first stage, the first stage generating the true in-phase output clock;
   wherein the second stage receives the true in-phase output clock from the first stage on the gate of the charging transistor and on the gate of the discharging transistor in the second stage, the second stage generating the complement quadrature output clock;
   wherein the third stage receives the complement quadrature output clock from the second stage on the gate of the charging transistor and on the gate of the discharging transistor in the third stage, the third stage generating the complement in-phase output clock;
   wherein the fourth stage receives the complement in-phase output clock from the third stage on the gate of the charging transistor and on the gate of the discharging transistor in the fourth stage, the fourth stage generating the true quadrature output clock.

7. The QIQO clock divider of claim 6 wherein the in-phase charging-logic transistor and the in-phase evaluation transistor in the first stage have gates receiving the complement in-phase clock from the IQ input;

wherein the quadrature charging-logic transistor and the quadrature evaluation transistor in the first stage have gates receiving the true quadrature clock from the IQ input;

wherein the in-phase charging-logic transistor and the in-phase evaluation transistor in the third stage have gates receiving the true in-phase clock from the IQ input;

wherein the quadrature charging-logic transistor and the quadrature evaluation transistor in the third stage have gates receiving the complement quadrature clock from the IQ input.

8. The QIQO clock divider of claim 7 wherein the in-phase charging-logic transistor and the in-phase evaluation transistor in the second stage have gates receiving the complement in-phase clock from the IQ input;

wherein the quadrature charging-logic transistor and the quadrature evaluation transistor in the second stage have gates receiving the complement quadrature clock from the IQ input;

wherein the in-phase charging-logic transistor and the in-phase evaluation transistor in the fourth stage have gates receiving the true in-phase clock from the IQ input;

wherein the quadrature charging-logic transistor and the quadrature evaluation transistor in the fourth stage have gates receiving the true quadrature clock from the IQ input.

9. The QIQO clock divider of claim 7 wherein the in-phase charging-logic transistor and the in-phase evaluation transistor in the second stage have gates receiving the true in-phase clock from the IQ input;

wherein the quadrature charging-logic transistor and the quadrature evaluation transistor in the second stage have gates receiving the true quadrature clock from the IQ input;

wherein the in-phase charging-logic transistor and the in-phase evaluation transistor in the fourth stage have gates receiving the complement in-phase clock from the IQ input;

wherein the quadrature charging-logic transistor and the quadrature evaluation transistor in the fourth stage have gates receiving the complement quadrature clock from the IQ input.

10. The QIQO clock divider of claim 9 further comprising:

a first bi-stable element coupled between the true in-phase output clock generated by the first stage and the complement in-phase output clock generated by the third stage, the first bi-stable element regenerating the true in-phase output clock and the complement in-phase output clock into opposite states; and a second bi-stable element coupled between the complement quadrature output clock generated by the second stage and the true quadrature output clock generated by the fourth stage, the second bi-stable element regenerating the true quadrature output clock and the complement quadrature output clock into opposite states.

11. The QIQO clock divider of claim 10 further comprising:

a first delay element coupled between the first stage and the second stage, for delaying the true in-phase output clock generated by the first stage for delayed use by the charging and discharging transistors in the second stage;

a second delay element coupled between the second stage and the third stage, for delaying the complement quadrature output clock generated by the second stage for delayed use by the charging and discharging transistors in the third stage;

a third delay element coupled between the third stage and the fourth stage, for delaying the complement in-phase output clock generated by the third stage for delayed use by the charging and discharging transistors in the fourth stage; and a fourth delay element coupled between the fourth stage and the first stage, for delaying the true quadrature output clock generated by the fourth stage for delayed use by the charging and discharging transistors in the first stage.

12. The QIQO clock divider of claim 11 wherein the first delay element is a clocked flip-flop that is clocked by the complement in-phase clock;

wherein the second delay element is a clocked flip-flop that is clocked by the true quadrature clock;

wherein the third delay element is a clocked flip-flop that is clocked by the true in-phase clock;

wherein the fourth delay element is a clocked flip-flop that is clocked by the complement quadrature clock.

13. The QIQO clock divider of claim 12 wherein the odd divisor is five, and the input frequency is five times the output frequency.

14. The QIQO clock divider of claim 12 wherein the true in-phase output clock, the complement in-phase output clock, the true quadrature output clock, and the complement quadrature output clock each have a duty cycle within +/−10% of 50%.

15. A quadrature clock divider comprising:

a clock input that receives a true in-phase clock having a nominal phase delay of zero, a true quadrature clock having a nominal phase delay of 90 degrees, a complement in-phase clock having a nominal phase delay of 180 degrees, and a complement quadrature clock having a nominal phase delay of 270 degrees;

a plurality of stages, each stage receiving a quadrature clock that is the true quadrature clock or the complement quadrature clock, and each receiving an in-phase clock that is the true in-phase clock or the complement in-phase clock, each stage also receiving a prior-stage output and each stage generating a stage output;

each stage in the plurality of stages comprising:

a charging network that charges the stage output when the prior-stage output, the quadrature clock, and the in-phase clock are all in a low state; and an evaluation network that discharges the stage output when the prior-stage output, the quadrature clock, and the in-phase clock are all in a high state;

wherein the plurality of stages comprises a first stage, a second stage, a third stage, and a fourth stage;

wherein the stage output generated by the first stage is a true in-phase output clock, the first stage receiving the stage output of the fourth stage;

wherein the stage output generated by the second stage is a complement quadrature output clock having a nominal output phase delay of 270 degrees relative to the true in-phase output clock, the second stage receiving the stage output of the first stage;

wherein the stage output generated by the third stage is a complement in-phase output clock having a nominal output phase delay of 180 degrees relative to the true in-phase output clock, the third stage receiving the stage output of the second stage;

wherein the stage output generated by the fourth stage is a true quadrature output clock having a nominal output phase delay of 90 degrees relative to the true in-phase output clock, the fourth stage receiving the stage output of the third stage.

16. The quadrature clock divider of claim 15 wherein the charging network comprises:
a p-channel charging transistor having a gate that receives the prior-stage output;
a p-channel in-phase charging-logic transistor having a gate receiving the in-phase clock;
a p-channel quadrature charging-logic transistor having a gate receiving the quadrature clock;
wherein the p-channel charging transistor, the p-channel in-phase charging-logic transistor, and the p-channel quadrature charging-logic transistor have conducting channels that are in series between a power supply and the stage output;
wherein the evaluation network comprises:
an n-channel discharging transistor having a gate that receives the prior-stage output;
an n-channel in-phase evaluation transistor having a gate receiving the in-phase clock;
an n-channel quadrature evaluation transistor having a gate receiving the quadrature clock;
wherein the n-channel discharging transistor, the n-channel in-phase evaluation transistor, and the n-channel quadrature evaluation transistor have conducting channels that are in series between the stage output and a ground.

17. The quadrature clock divider of claim 16 wherein the p-channel charging transistor has a source connected to the power supply;
wherein the n-channel discharging transistor has a source connected to the ground.

18. The quadrature clock divider of claim 17 wherein the in-phase clock that is input to the first stage is the complement in-phase clock, and the quadrature clock input to the first stage is the true quadrature clock;
wherein the in-phase clock that is input to the second stage is the complement in-phase clock, and the quadrature clock input to the second stage is the complement quadrature clock;
wherein the in-phase clock that is input to the third stage is the true in-phase clock, and the quadrature clock input to the third stage is the complement quadrature clock;
wherein the in-phase clock that is input to the fourth stage is the true in-phase clock, and the quadrature clock input to the fourth stage is the true quadrature clock.

19. The quadrature clock divider of claim 17 further comprising:
a first inverter receiving the complement in-phase output clock and driving the true in-phase output clock;
a second inverter receiving the true in-phase output clock and driving the complement in-phase output clock;
a third inverter receiving the complement quadrature output clock and driving the true quadrature output clock;
a fourth inverter receiving the true quadrature output clock and driving the complement quadrature output clock;

wherein the in-phase clock that is input to the first stage is the complement in-phase clock, and the quadrature clock input to the first stage is the true quadrature clock;
wherein the in-phase clock that is input to the second stage is the true in-phase clock, and the quadrature clock input to the second stage is the true quadrature clock;
wherein the in-phase clock that is input to the third stage is the true in-phase clock, and the quadrature clock input to the third stage is the complement quadrature clock;
wherein the in-phase clock that is input to the fourth stage is the complement in-phase clock, and the quadrature clock input to the fourth stage is the complement quadrature clock.

20. A Quadrature-In, Quadrature-Out (QIQO) divide-by-three circuit comprising:
a clock input that receives a true in-phase clock having a nominal phase delay of zero, a true quadrature clock having a nominal phase delay of 90 degrees, a complement in-phase clock having a nominal phase delay of 180 degrees, and a complement quadrature clock having a nominal phase delay of 270 degrees;
a first logic gate comprising:
a first p-channel charging transistor having a gate that receives a true quadrature output clock;
a first p-channel in-phase charging-logic transistor having a gate receiving the complement in-phase clock;
a first p-channel quadrature charging-logic transistor having a gate receiving the true quadrature clock;
wherein the first p-channel charging transistor, the first p-channel in-phase charging-logic transistor, and the first p-channel quadrature charging-logic transistor have conducting channels that are in series between a power supply and a true in-phase output clock that is generated by the first logic gate;
a first n-channel discharging transistor having a gate that receives the true quadrature output clock;
a first n-channel in-phase evaluation transistor having a gate receiving the complement in-phase clock;
a first n-channel quadrature evaluation transistor having a gate receiving the true quadrature clock;
wherein the first n-channel discharging transistor, the first n-channel in-phase evaluation transistor, and the first n-channel quadrature evaluation transistor have conducting channels that are in series between the true in-phase output clock and a ground;
a second logic gate comprising:
a second p-channel charging transistor having a gate that receives the true in-phase output clock;
a second p-channel in-phase charging-logic transistor having a gate receiving the true in-phase clock;
a second p-channel quadrature charging-logic transistor having a gate receiving the true quadrature clock;
wherein the second p-channel charging transistor, the second p-channel in-phase charging-logic transistor, and the second p-channel quadrature charging-logic transistor have conducting channels that are in series between the power supply and a complement quadrature output clock that is generated by the second logic gate;
a second n-channel discharging transistor having a gate that receives the true in-phase output clock;
a second n-channel in-phase evaluation transistor having a gate receiving the true in-phase clock;
a second n-channel quadrature evaluation transistor having a gate receiving the true quadrature clock;

wherein the second n-channel discharging transistor, the second n-channel in-phase evaluation transistor, and the second n-channel quadrature evaluation transistor have conducting channels that are in series between the complement quadrature output clock and the ground;

a third logic gate comprising:
a third p-channel charging transistor having a gate that receives the complement quadrature output clock;
a third p-channel in-phase charging-logic transistor having a gate receiving the true in-phase clock;
a third p-channel quadrature charging-logic transistor having a gate receiving the complement quadrature clock;
wherein the third p-channel charging transistor, the third p-channel in-phase charging-logic transistor, and the third p-channel quadrature charging-logic transistor have conducting channels that are in series between the power supply and a complement in-phase output clock that is generated by the third logic gate;
a third n-channel discharging transistor having a gate that receives the complement quadrature output clock;
a third n-channel in-phase evaluation transistor having a gate receiving the true in-phase clock;
a third n-channel quadrature evaluation transistor having a gate receiving the complement quadrature clock;
wherein the third n-channel discharging transistor, the third n-channel in-phase evaluation transistor, and the third n-channel quadrature evaluation transistor have conducting channels that are in series between the complement in-phase output clock and the ground;

a fourth logic gate comprising:
a fourth p-channel charging transistor having a gate that receives the complement in-phase output clock;
a fourth p-channel in-phase charging-logic transistor having a gate receiving the complement in-phase clock;
a fourth p-channel quadrature charging-logic transistor having a gate receiving the complement quadrature clock;
wherein the fourth p-channel charging transistor, the fourth p-channel in-phase charging-logic transistor, and the fourth p-channel quadrature charging-logic transistor have conducting channels that are in series between the power supply and the true quadrature output clock that is generated by the fourth logic gate;
a fourth n-channel discharging transistor having a gate that receives the complement in-phase output clock;
a fourth n-channel in-phase evaluation transistor having a gate receiving the complement in-phase clock;
a fourth n-channel quadrature evaluation transistor having a gate receiving the complement quadrature clock;
wherein the fourth n-channel discharging transistor, the fourth n-channel in-phase evaluation transistor, and the fourth n-channel quadrature evaluation transistor have conducting channels that are in series between the true quadrature output clock and the ground;

a first inverter receiving the complement in-phase output clock and driving the true in-phase output clock;

a second inverter receiving the true in-phase output clock and driving the complement in-phase output clock;

a third inverter receiving the complement quadrature output clock and driving the true quadrature output clock; and a fourth inverter receiving the true quadrature output clock and driving the complement quadrature output clock.

\* \* \* \* \*